(12) United States Patent
Chin et al.

(10) Patent No.: US 8,288,860 B2
(45) Date of Patent: Oct. 16, 2012

(54) MEMORY DEVICE SYSTEM WITH STACKED PACKAGES

(75) Inventors: Chee Keong Chin, Shanghai (CN); Yu Feng Feng, Shanghai (CN); Wen Bin Qu, Shanghai (CN)

(73) Assignee: Stats Chippac Ltd., Singapore (SG)

( * ) Notice: Subject to any disclaimer, the term of this patent is extended or adjusted under 35 U.S.C. 154(b) by 275 days.

(21) Appl. No.: 12/207,493

(22) Filed: Sep. 9, 2008

(65) Prior Publication Data

US 2009/0072378 A1  Mar. 19, 2009

Related U.S. Application Data

(60) Provisional application No. 60/971,261, filed on Sep. 10, 2007.

(51) Int. Cl.
*H01L 23/12* (2006.01)
*H01L 23/053* (2006.01)

(52) U.S. Cl. . 257/701; 257/692; 257/704; 257/E23.012; 257/E23.015; 257/E23.031; 438/121; 438/125; 438/111

(58) Field of Classification Search ............ 29/840; 257/688, 678, 679, 685, 686, 687, 690, 692, 257/693, 711, 777, 778, E21.001, E23.01, 257/E23.003, E23.012, E23.015, E23.031, 257/E23.79, E23.083, E21.705, 702, 704, 257/724; 361/600, 745, 752, 759, 760, 769, 361/820; 438/106, 107, 108, 109, 111, 121, 438/122, 123, 125, FOR. 365, FOR. 368, 438/FOR. 369, FOR. 375, FOR. 381

See application file for complete search history.

(56) References Cited

U.S. PATENT DOCUMENTS

| | | | |
|---|---|---|---|
| 5,956,233 A * | 9/1999 | Yew et al. | 361/760 |
| 6,207,474 B1 * | 3/2001 | King et al. | 438/107 |
| 6,408,509 B1 * | 6/2002 | Kinsman et al. | 29/840 |
| 6,847,105 B2 | 1/2005 | Koopmans | |
| 7,057,269 B2 | 6/2006 | Karnezos | |
| 7,183,643 B2 | 2/2007 | Gibson et al. | |
| 7,193,304 B2 | 3/2007 | Kuo et al. | |
| 7,253,511 B2 | 8/2007 | Karnezos et al. | |
| 2003/0107138 A1 * | 6/2003 | Tian et al. | 257/787 |
| 2004/0147143 A1 * | 7/2004 | Yu et al. | 439/76.1 |
| 2007/0040261 A1 | 2/2007 | Hetzel et al. | |

* cited by examiner

*Primary Examiner* — Olik Chaudhuri
*Assistant Examiner* — Quovaunda V Jefferson
(74) *Attorney, Agent, or Firm* — Ishimaru & Associates LLP; Mikio Ishimaru; Stanley M. Chang

(57) ABSTRACT

An integrated circuit package system includes: providing a base package of an elongated rectangular-box shape containing first electrical circuitry and including: forming a rectangular contact strip on and adjacent to a first end of the base package; and forming a base contact pad on and adjacent to a second end of the base package for connection to an electrical interconnect.

20 Claims, 4 Drawing Sheets

MEMORY DEVICE SYSTEM WITH STACKED PACKAGES

CROSS-REFERENCE TO RELATED APPLICATION(S)

This application claims the benefit of U.S. Provisional Patent Application Ser. No. 60/971,261 filed Sep. 10, 2007, and the subject matter thereof is incorporated herein by reference thereto.

TECHNICAL FIELD

The present invention relates generally to integrated circuit package systems, and more particularly to a stacked flash memory device package system.

BACKGROUND ART

With the increasing demand for portable consumer electronics, there is a driving need for high-capacity storage devices. Non-volatile semiconductor memory devices, such as flash memory storage packages or sticks, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Flash memory storage sticks are coming into use that are fabricated as system-in-a-package (SiP) or multichip modules (MCM), where a plurality of die are mounted on a substrate. The substrate may in general include a rigid base having a conductive layer etched on one or both sides. Electrical connections are formed between the die and the conductive layers, and the conductive layers provide an electric lead structure for integration of the die into an electronic system. Once electrical connections between the die and substrate are made, the assembly is then typically encased in a molding compound to provide a protective package.

In view of the small form factor requirements, as well as the fact that flash memory devices need to be removable and not permanently attached to a printed circuit board, such cards are often built of a land grid array (LGA) package. In an LGA package, the semiconductor die are electrically connected to exposed contact fingers formed on a lower surface of the package. External electrical connection with other electronic components on a host printed circuit board (PCB) is accomplished by bringing the contact fingers into pressure contact with complementary electrical pads on the PCB. LGA packages are ideal for flash memory devices in that they have a smaller profile and lower inductance than pin grid array (PGA) and ball grid array (BGA) packages.

Semiconductor die are typically batch processed on leadframes and then singulated into individual packages upon completion of the fabrication process.

There is a continuing need to increase memory capacity without increasing the dimensions of the flash memory device.

There is also a problem with memory device yield because the individual packages sometimes contain inoperative controller chips, which are the heart of the memory device.

Thus, a need still remains for improving memory devices.

In view of the need, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system that includes: providing a base package of an elongated rectangular-box shape containing first electrical circuitry and including: forming a rectangular contact strip on and adjacent to a first end of the base package; and forming a base contact pad on and adjacent to a second end of the base package for connection to an electrical interconnect in a block.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
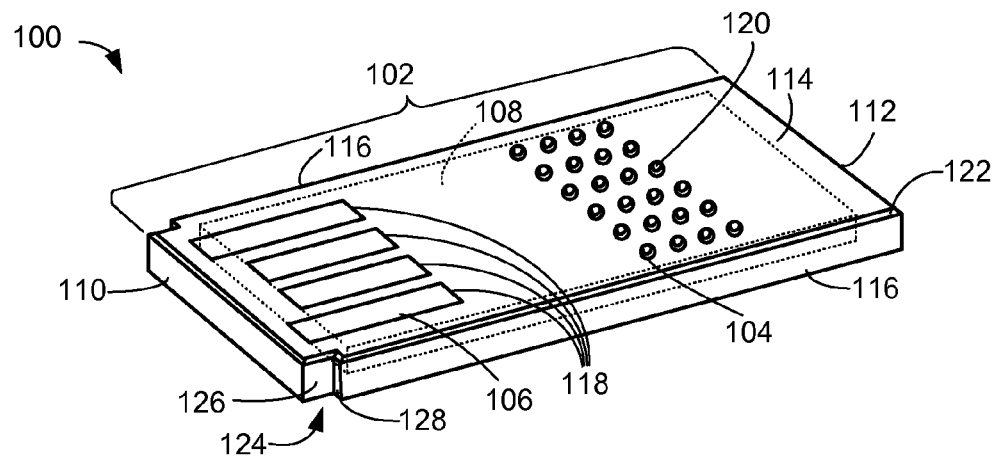
FIG. 1 is an isometric view of an integrated circuit package system in a base packaging phase of a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown an isometric view of an integrated circuit package system 100 in a base packaging phase of a first embodiment of the present invention. The integrated circuit package system 100 includes a base package 102 of a rectangular-box configuration with base contact pads 104 and rectangular contact strips 106 separated from the base contact pads 104 on the base package 102. The base package 102 may be a land grid array system-in-a-package (SiP) containing first electrical circuitry 108 such as passive components, a NAND memory die, a memory controller, or a combination thereof.

The base package 102 can have a rectangular shape consisting of a first end 110, a second end 112 opposite the first end 110, a first side 114, and base side surfaces 116. The base package 102 is manufactured with pre-determined dimensions of length between the first end 110 and the second end 112, of width between both of the base side surfaces 116, and of thickness between the first side 114 and a surface opposite the first side 114.

The base contact pads 104 and the rectangular contact strips 106 can provide connectivity with the first electrical circuitry 108 of the base package 102 as-well-as between physical locations of one another. The rectangular contact strips 106 can be substantially exposed on the first side 114 and located near the first end 110, and oriented lengthwise and parallel to each of the base side surfaces 116.

Figure 6:
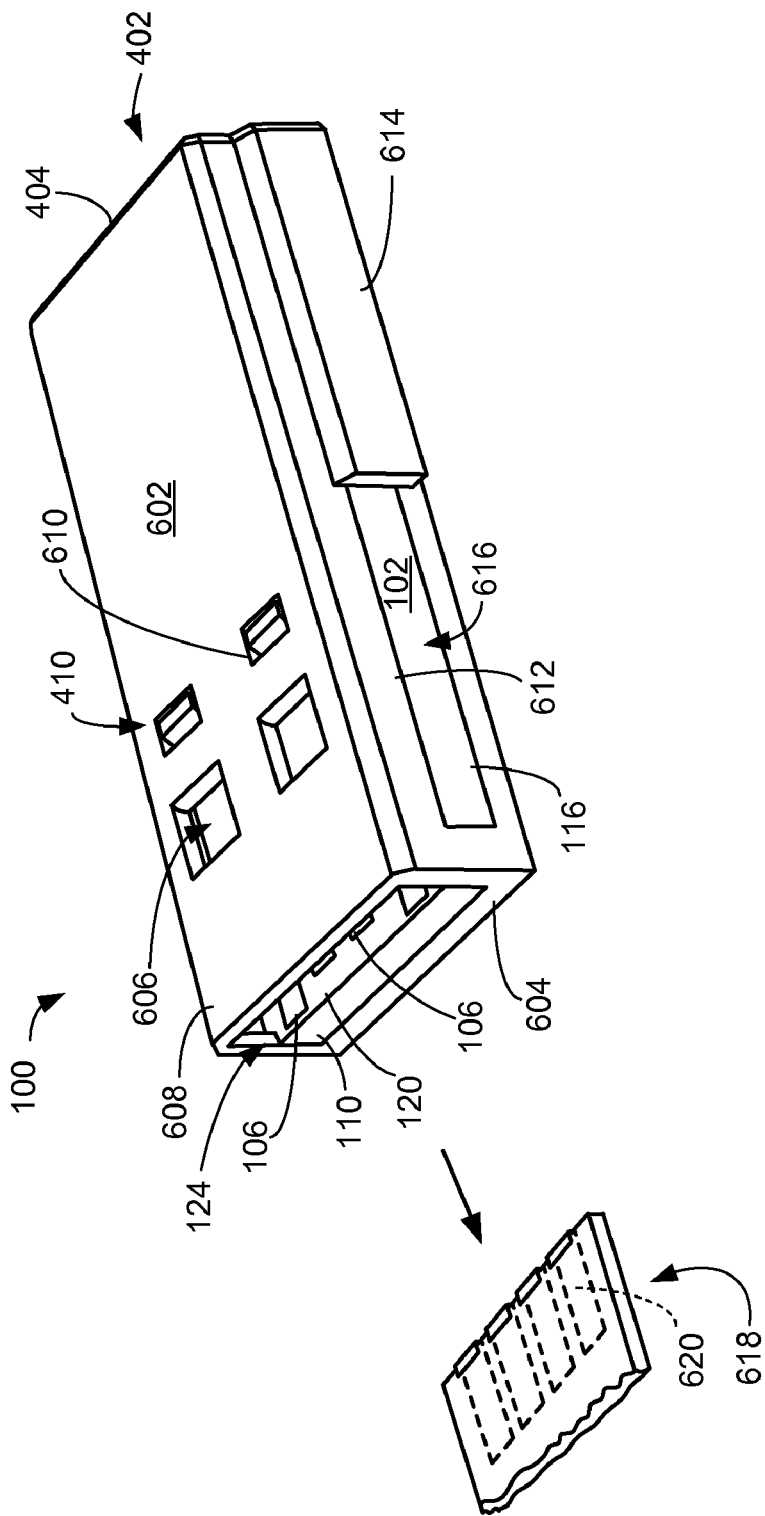
FIG. 6 is an isometric view of the integrated circuit package system insertion into a portion of a next level system connector in the first embodiment of the present invention.

The rectangular contact strips 106 can be used to engage system contacts 620 of FIG. 6 in a next level system integration providing connectivity to the base package 102. Back ends 118 of the rectangular contact strips 106 are aligned at a fixed pre-determined distance from the first end 110. The rectangular contact strips 106 can each have different physical lengths to control the rate and order of engagement with the system contacts 620 of FIG. 6.

The base contact pads 104 can be substantially exposed on the first side 114. The base contact pads 104 are positioned in a rectangular grid pattern near the second end 112, between the rectangular contact strips 106 and the second end 112 of the base package 102. The electrical interconnects 120, such as pressure contacts or ball contacts, are attached to the base contact pads 104 on the first side 114 to provide connectivity between another device and the first electrical circuitry 108 of the base package 102.

Figure 2:
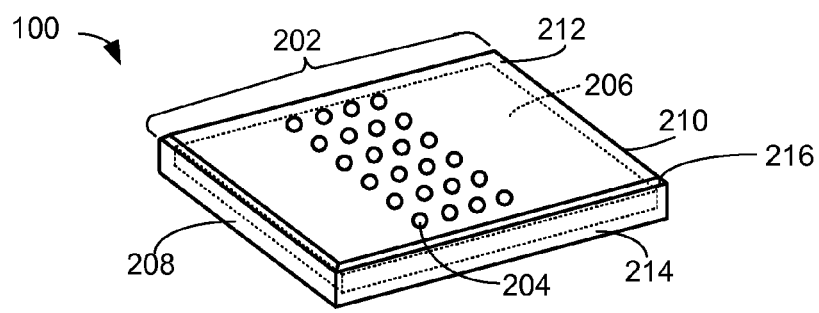
FIG. 2 is an isometric view of the integrated circuit package system in a stack packaging phase of the present invention.

The end of the electrical interconnects 120 opposite the attached end of the electrical interconnects 120 can be held in contact onto the stack contact pads 204 of FIG. 2 using a pre-determined amount of applied clamping force from the base package 102 towards the stack package 202 of FIG. 2 or from the stack package 202 towards the base package 102.

The pre-determined amount of clamping force can be selected to provide continued electrical connectivity between the first electrical circuitry 108 of the base package 102 and the stack package 202 and under any user specified conditions. Note the electrical interconnects 120 could optionally be attached by one end to the stack contact pads 204 and the end opposite the attached end held in contact onto the base contact pads 104 using the pre-determined amount of applied clamping force.

A chamfer edge 122, such as a flat oblique surface, can optionally be formed around the perimeter edge of the first side 114 to accommodate integration with a next level component having slide rail guides parallel to the first side 114. Front corner cavities 124 can be located at each end of the first end 110 intersecting each of the base side surfaces 116 and used to provide structural interlock capability in the next level of component integration.

Each of the front corner cavities 124 can be formed having a front cut surface 126 intersected and perpendicular to a side cut surface 128. The front cut surface 126 and the side cut surface 128 each form a rectangular shaped surface area. The side cut surface 128 is parallel to the first end 110 and has a dimensional length equivalent to the dimensional thickness of the base package 102. The side cut surface 128 has a dimensional width having a pre-determined distance from an adjacent side consisting of one of the base side surfaces 116.

The base package 102 can be inserted horizontally in a direction forward of the first end 110 to establish connectivity between a next level system connector 618 of FIG. 6 and the rectangular contact strips 106.

Referring now to FIG. 2, therein is shown an isometric view of the integrated circuit package system 100 in a stack packaging phase of the present invention. The integrated package system 100 can preferably include the stack package 202 of a rectangular-box configuration having the base contact pads 204. The stack package 202 may be a land grid array system-in-a-package (SiP) and can contain second electrical circuitry 206 such as passive components, an additional NAND memory die, a memory controller, or a combination thereof.

The stack package 202 can have a rectangular shape consisting of a stack front surface 208, a stack back surface 210, a stack connection surface 212, and stack side surfaces 214. The stack package 202 is manufactured with pre-determined dimensions of length between the stack front surface 208 and the stack back surface 210, of width between both of the stack side surfaces 214, and of thickness between the stack connection surface 212 and a surface opposite the stack connection surface 212.

The dimensional length of the stack package 202 is substantially less than the dimensional length of the base package 102 of FIG. 1 and substantially greater than a perimeter area surrounding all of the base contact pads 104 of FIG. 1. The dimensional width of the stack package 202 is equivalent to the dimensional width of the base package 102. The chamfer edge 216 can optionally be formed around the perimeter edge of the stack connection surface 212 to accommodate integration with a next level component having slide rail guides parallel to the stack connection surface 212.

The stack contact pads 204 can provide connectivity with the second electrical circuitry 206 of the stack package 202. The stack contact pads 204 can be substantially exposed on the stack connection surface 212 and located directly over the electrical interconnects 120 of FIG. 1 when the stack package 202 is oriented with the stack connection surface 212 facing the first side 114 of FIG. 1 and the stack back surface 210 vertically aligned with the second end 112 of FIG. 1.

Figure 3:
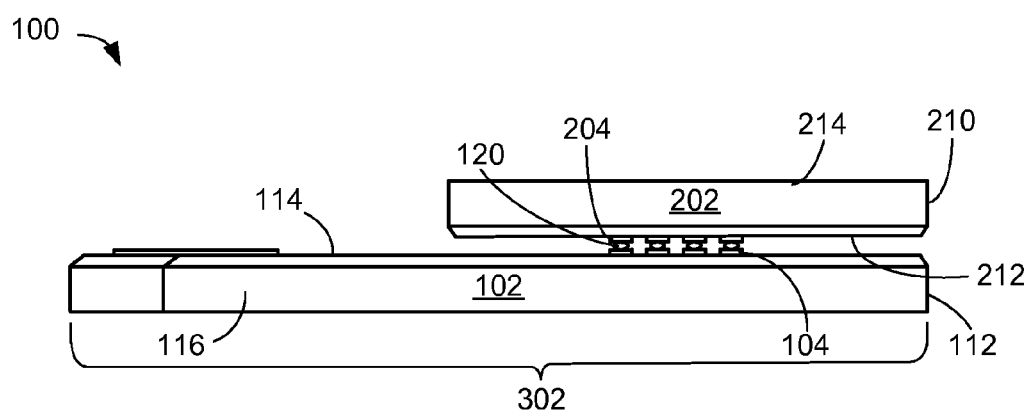
FIG. 3 is a side view of the integrated circuit package system in a packaging connection phase of the present invention.

Referring now to FIG. 3, therein is shown a side view of the integrated circuit package system 100 in a packaging connection phase of the present invention. The integrated circuit package system 100 can preferably include a memory component stack 302 with the base package 102 having the electrical interconnects 120 and the stack package 202. The stack back surface 210 is vertically aligned with the second end 112 and the stack side surfaces 214 are vertically aligned with the base side surfaces 116.

The stack package 202 is oriented with stack contact pads 204 of the stack connection surface 212 facing and in contact with the electrical interconnects 120 exposed on the first side 114. The end of the electrical interconnects 120 opposite the end attached to the base package 102 can be held in contact with the stack contact pads 204 using a pre-determined amount of applied clamping force from the base package 102 towards the stack package 202 or from the stack package 202 towards the base package 102.

The memory component stack 302, consisting of the base package 102 with the electrical interconnects 120 and the stack package 202, is small enough to fit into a memory device casing 602 of FIG. 6.

It has also been discovered that the electrical connection between the base package 102 and the stack package 202 can be an easily made pressure contact electrical connection providing for removability and replaceability of components, rather than a permanent solder or other connection which would require additional processing. In the alternative, it has been discovered that a surface mount technology or flip chip electrical connection processes can also be easily used.

Figure 4:
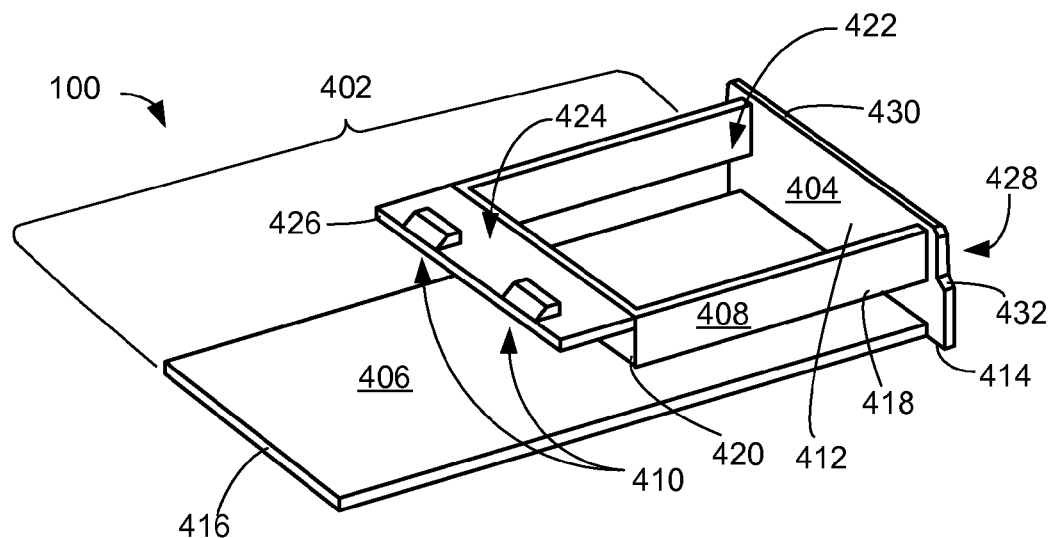
FIG. 4 is an isometric view of a memory device cap in accordance with the first embodiment of the present invention.

Referring now to FIG. 4, therein is shown an isometric view of a device cap 402 in accordance with the first embodiment of the present invention. The device cap 402, such as a memory device cap, can preferably include having a cap 404, a base shelf structure 406, a stack frame structure 408, and tapered cap retainers 410. The device cap 402 is small enough to fit into the memory device casing 602 of FIG. 6.

The cap 404 can be rectangular in shape having a predefined thickness and a dimensional width substantially greater than the dimensional width of the base package 102 of FIG. 1. The cap 404 can have a dimensional height substantially greater than the aggregate summations of the dimensional thickness of the base package 102, of the dimensional thickness of the stack package 202 of FIG. 2, and of the distance between the stack connection surface 212 of FIG. 1 and the first side 114 of FIG. 2. The cap 404 includes the base shelf structure 406 and the stack frame structure 408.

The base shelf structure 406 can extend perpendicularly from a lower portion of the cap front surface 412 of the cap 404 and is parallel with the length of a bottom edge 414 of the cap 404. The base shelf structure 406 can consists of a rectangular support structure having pre-determined dimensions of length, width, and thickness. The dimensional length and width of the base shelf structure 406 can be equivalent to the dimensional length and width of the base package 102 of FIG. 1. A front base shelf edge 416 is located on the end opposite the end of the base shelf structure 406 attached to the cap front surface 412.

The stack frame structure 408 can be located a pre-determined distance over the base shelf structure 406 and extend perpendicularly from an upper portion of the cap front surface 412 of the cap 404. The stack frame structure 408 includes frame sides 418 and a front frame side 420. The frame sides 418 can be have an end attached to the cap front surface 412 and an opposite end of the frame sides 418 attached to the front frame side 420.

The stack frame structure 408, extending from the upper portion of the cap front surface of the cap 404, forms a confined rectangular area 422 having the dimensional length and width of the stack package 202 of FIG. 2. The front frame side 420 of the stack frame structure 408 can include a front platform 424 attached perpendicularly to the front frame side 420 and extending away from the front frame side 420. The top surface of the front platform 424 can located within a horizontal plane formed having the top surface of the stack frame structure 408.

The tapered cap retainers 410 having a geometric shape with five exposed surfaces can be formed on the top surface of the front platform 424. Three of the five sides of the tapered cap retainers 410 are perpendicular to the top surface of the front platform 424 and have a pre-determined height above the top surface of the front platform 424. A forth side of the tapered cap retainers 410 originates from the front platform edge 426, extends towards the cap 404, rising at a fixed oblique angle relative to the length of the base shelf structure 406. A fifth side of the tapered cap retainers 410 is parallel to the top surface of the front platform 424 and intersects the other four sides.

The tapered cap retainers 410 can be used to interlock the device cap 402 within a next level of package integration. The cap 404 can optionally include a notch 428 located at each of two opposite comers adjacent a top edge 430 of the cap 404. The notch 428 can optionally be formed having shaped comers 432 such as oblique flat corner surfaces or curved surfaces. The tapered cap retainers 410 can provide for the removability of the device cap 402 from the next level of package integration resulting greatly improved serviceability and configurability of any components associated with the device cap 402.

Figure 5:
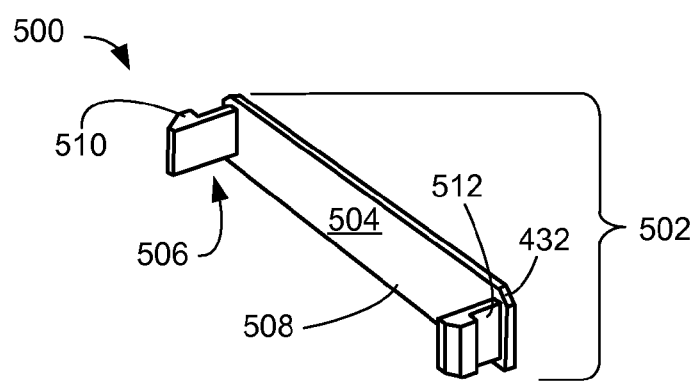
FIG. 5 is an isometric view of a memory device cap of an integrated circuit package system in accordance with a second embodiment of the present invention.

Referring now to FIG. 5, therein is shown an isometric view of a device cap 502 of an integrated circuit package system 500 in accordance with a second embodiment of the present invention. The device cap 502, such as a memory device cap, can preferably include a cap 504 rectangular in shape having side supports 506, and the tapered cap retainers 510. The device cap 502 is small enough to fit into the memory device casing 702 of FIG. 7.

The cap 504 can be rectangular in shape having a predefined thickness and a dimensional width substantially greater than the dimensional width of the base package 102 of FIG. 1. The cap 504 can have a dimensional height substantially greater than the aggregate summations of the dimensional thickness of the base package 102 and the distance between the stack connection surface 212 of FIG. 1 and the first side 114 of FIG. 2.

The cap 504 includes the side supports 506 having a rectangular shape protruding perpendicularly from a cap front surface 508 on each end of the cap 504. The side supports 506 are separated by a distance greater than the dimensional width of the base package 102. The tapered cap retainers 510 can be formed on outer facing surfaces 512 of each of the side supports 506 to interlock the device cap 502 within a next level of package integration. The tapered cap retainers 510 can provide for the removability of the device cap 502 from the next level of package integration resulting greatly improved serviceability and configurability of any components associated with the device cap 502. The cap 504 can optionally be formed having the shaped corners 432.

Referring now to FIG. 6, therein is shown an isometric view of the integrated circuit package system 100 insertion into a portion of the next level system connector 618 in the first embodiment of the present invention. The integrated circuit package system 100 includes the memory device casing 602, the device cap 402, the base package 102 having the electrical interconnects 120 of FIG. 1 and the stack package 202 of FIG. 2.

The memory device casing 602 consists of a rectangular case consisting of metal, plastic, or similar rigid material having an overall dimensional length, width, and thickness of 25 mm, 14 mm, and 5 mm respectively and non-conductive interior surfaces. Each end of the memory device casing 602 is open and internally unobstructed of material from one end to the other end. A front open frame 604 can be located on the one end of the memory device casing 602. The front open frame 604 has an opening slightly smaller than the interior and opening of at the opposite end of the memory device casing 602.

Rectangular latch openings 606 on a casing top surface 608 of the memory device casing 602 and located near the front open frame 604 can optionally be used to provide a next level insertion latch retention relief. Cap retainer reliefs 610, located on the casing top surface 608, adjacent the sides of the rectangular latch openings 606 furthest away from the front open frame 604 provide an opening that can interlock with the tapered cap retainers 410 of FIG. 4 to retain the device cap 402 and the base package 102 within the memory device casing 602.

The memory device casing 602 includes case sides 612 having exterior case protrusions 614 adjacent the end opposite the end closest the front open frame 604. The exterior case protrusions 614 extend a fixed perpendicular distance away from the case sides 612 resulting in a widening of the interior opening near the end opposite the end closest the front open frame 604 of the memory device casing 602.

A narrow rectangular slot 616 located centrally along the case sides 612 between the exterior case protrusions 614 and the end closest the front open frame 604. The narrow rectangular slot 616 can be used to guide and retain each of the base side surfaces 116 to provide structural support of the base package 102 within the memory device casing 602. The base package 102 having the electrical interconnects 120 can be oriented with the electrical interconnects 120 facing towards the confined rectangular area 422 of FIG. 4.

The first end 110 of the base package 102 can be aligned with the front base shelf edge 416 of FIG. 4 and the base package 102 mounted onto the base shelf structure 406 of FIG. 4. The stack package 202 can be oriented with the stack contact pads 204 of FIG. 2 facing towards the electrical interconnects 120 of the base package 102 and the stack front surface 208 of FIG. 2 facing towards the front base shelf edge 416. The stack package 202 is placed into the confined rectangular area 422, mounting the stack package 202 over the base package 102.

The device cap 402 can be horizontally inserted into the interior of the memory device casing 602 from the end opposite of the end closest the front open frame 604 towards the front open frame 604. The interior dimensions of the memory device casing 602 provide a pre-determined clamping force onto the surface opposite the stack connection surface 212 and onto the surface of the base shelf structure 406 of FIG. 4 in contact with the interior of the memory device casing 602 to maintain electrical connectivity between the stack package 202 and the base package 102.

The tapered cap retainers 410 of the device cap 402 interlock into the cap retainer reliefs 610 on the casing top surface 608 of the device cap 402 as each of the corner cavities 124 contact the interior of the memory device casing 602 near the front open frame 604 resulting in the integrated circuit package system 100. The device cap 402 mounts and retains the base package 102 and the stack package 202 within the memory device casing 602. The tapered cap retainers 410 can provide for the removability of the device cap 402 from the memory device casing 602, resulting in greatly improved serviceability and configurability of any components such as the base package 102 or the stack package 202.

The front open frame 604 of the memory device casing 602 can be inserted into the next level system connector 618 having the system contacts 620 connecting the rectangular contact strips 106 to the system contacts 620 to provide connectivity between a next level subsystem and the integrated circuit package system 100. The system contacts 620 can consist of resilient fingers or spring-loaded contacts having connectivity to the next level subsystem circuitry.

It has been discovered that the present invention thus has numerous aspects.

One of the aspects is the improved stacking method resulting in a high density of total memory capacity from a stacked memory device without an increase in the overall package dimensions.

Another of the aspects is the improved product yield due to the early testing of the individual packages prior to component stack and integration assembly phases.

Yet another of the aspects is the flexibility to configure and connect the second electrical circuitry 206 of the stack package 202 to operate as replacement, in conjunction, backup, extensions, or any combinations thereof with the first electrical circuitry 108 of the base package 102 using selective population of the electrical interconnects 120 or system level firmware.

These and other valuable aspects of the present invention consequently further the state of the technology to at least the next level.

Figure 7:
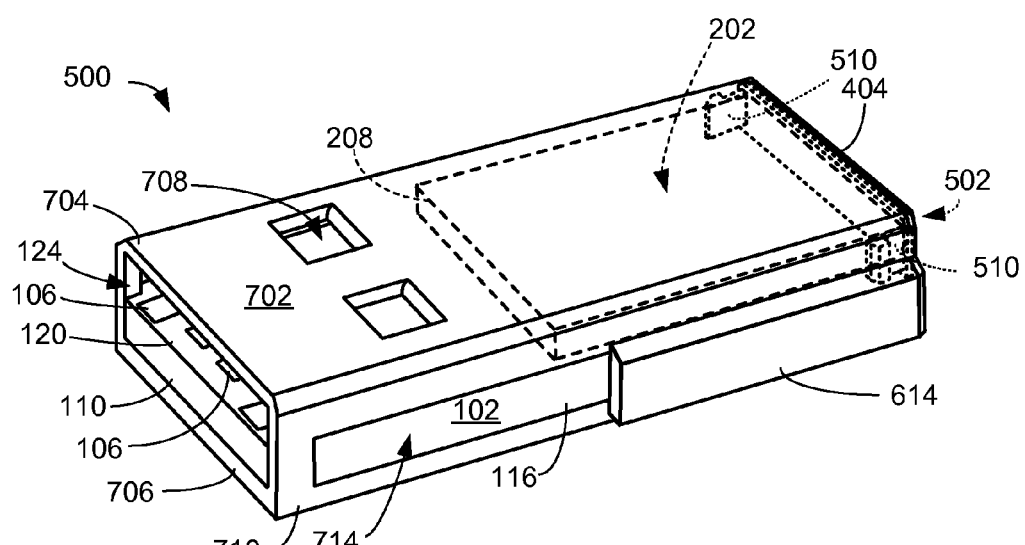
FIG. 7 is an isometric view of the integrated circuit package system in the second embodiment of the present invention.

Referring now to FIG. 7, therein is shown an isometric view of the integrated circuit package system 500 in the second embodiment of the present invention. The integrated circuit package system 500 includes the memory device casing 702, the device cap 502, the base package 102 having the electrical interconnects 120 of FIG. 1 and the stack package 202 of FIG. 2. The memory device casing 702 consists of a rectangular case consisting of metal, plastic, or similar rigid material having an overall dimensional length, width, and thickness of 25 mm, 14 mm, and 5 mm respectively and non-conductive interior surfaces.

Each end of the memory device casing 702 is open. A front open frame 706 can be located on the one end of the memory device casing 702. The front open frame 706 has an opening slightly smaller than the interior and opening at the opposite end of the memory device casing 702. Rectangular latch openings 708 on the casing top surface 704 of the memory device casing 702 and located near the front open frame 706 can optionally be used to provide a next level insertion latch retention relief.

The memory device casing 702 includes case sides 710 having exterior case protrusions 712 adjacent the end opposite the end closest the front open frame 706. The exterior case protrusions 712 extend a fixed perpendicular distance away from the case sides 710 resulting in a widening of the interior opening near the end opposite the end closest the front open frame 706 of the memory device casing 702.

A narrow rectangular slot 714 located centrally along the case sides 710 between the exterior case protrusions 712 and the end closest the front open frame 706. The narrow rectangular slot 714 can be used to guide and retain each of the base side surfaces 116 to provide structural support of the base package 102 within the memory device casing 702. provide ventilation between the interior and exterior of the memory device casing 702. The memory component stack 302 of FIG. 3 can be inserted horizontally into the end opposite the end closest the front open frame 706 oriented with first end 110 facing the front open frame 706 of the memory device casing 702 and the stack contact pads 204 of FIG. 2 facing away from the surface opposite the casing top surface 704.

The interior dimensions of the memory device casing 702 provide a pre-determined clamping force on the surface opposite the stack connection surface 212 and on the surface opposite the first side 114 to maintain electrical connectivity between the stack package 202 and the base package 102. The device cap 502 can be horizontally inserted into at the end opposite the end closest the front open frame 706 directly towards the base package 102.

The cap retainers 510 of the device cap 502 can interlock with interior sides of the memory device casing 702. The device cap 502 physically contacts and retains the base package 102 within the memory device casing 702. The tapered cap retainers 510 can provide for the removability of the device cap 502 from the memory device casing 702, resulting in greatly improved serviceability and configurability of components such as the memory component stack 302.

The corner cavities 124 in contact with the interior of the memory device casing 702 prevent forward movement of the base package 102 within the integrated circuit package system 500. The front open frame 706 of the memory device casing 702 can be inserted into the next level system connector 618 of FIG. 6 having the system contacts 620 of FIG. 6 connecting the rectangular contact strips 106 to the system contacts 620 to provide connectivity between a next level subsystem and the integrated circuit package system 500.

Figure 8:
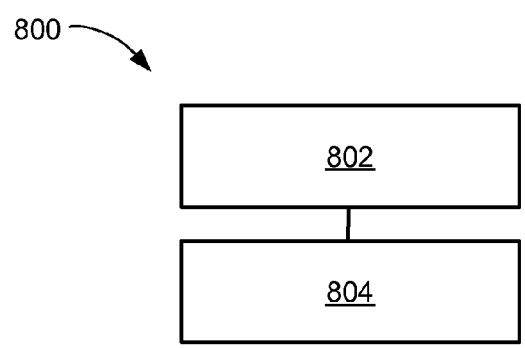
FIG. 8 therein is shown a flow chart of an integrated circuit package system for manufacturing the integrated circuit package system in an embodiment of the present invention.

Referring now to FIG. 8, therein is shown a flow chart of an integrated circuit package system 800 for manufacturing the integrated circuit package system 100 in an embodiment of the present invention. The system 800 includes providing a base package of an elongated rectangular-box shape containing first electrical circuitry and including: forming a rectangular contact strip on and adjacent to a first end of the base package in a block 802; and forming a base contact pad on and adjacent to a second end of the base package for connection to an electrical interconnect in a block 804.

In greater detail, a system to provide the method and apparatus of the integrated circuit package system 100, in an embodiment of the present invention, is performed as follows:
1. Providing a base package of an elongated rectangular-box shape containing first memory or controller circuitry and including: forming rectangular contact strips on a first side of and adjacent to a first end of the base package.
2. Forming base contact pads on a first side of and adjacent to a second end of the base package connected to electrical interconnects.

Thus, it has been discovered that the integrated circuit package system method and apparatus of the present invention furnish important and heretofore unknown and unavailable solutions, capabilities, and functional aspects.

The resulting processes and configurations are straightforward, cost-effective, uncomplicated, highly versatile and effective, can be implemented by adapting known technologies, and are thus readily suited for efficiently and economically manufacturing large die IC packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a device casing;
   providing a base package of an elongated rectangular-box shape, the base package containing first electrical circuitry and including:
      forming a rectangular contact strip on and adjacent to a first end of the base package and
      forming a base contact pad separated from the rectangular contact strip, on and adjacent to a second end of the base package opposite the first end, and for connection to an electrical interconnect;
   positioning a stack package with a stack contact pad in contact with the electrical interconnect;
   inserting the base package and the stack package in the device casing, the stack contact pad and the electrical interconnect clamped together between facing sides of the stack package and the base package; and
   inserting a device cap having tapered cap retainers in the device casing.

2. The method as claimed in claim 1 wherein:
   positioning the stack package includes positioning the stack package of a rectangular-box shape containing second electrical circuitry and including:
   forming the stack contact pad on the stack package for connection to the electrical interconnect.

3. The method as claimed in claim 1 wherein
   inserting the device cap includes inserting the device cap in the device casing to removably secure the base package relative to the stack package.

4. The method as claimed in claim 1 wherein
   inserting the base package and the stack package includes placing the base package and the stack package in the device cap for removably holding the stack package relative to the base package.

5. The method as claimed in claim 1 wherein
   inserting the base package and the stack package includes placing the base package and the stack package in the device cap for holding the stack package relative to the base package; and
   inserting the device cap includes inserting the device cap in the device casing and removably retained therein.

6. A method for manufacturing an integrated circuit package system comprising:
   providing a memory device casing;
   providing a base package of an elongated rectangular-box shape, the base package containing first memory or controller circuitry and including:
      forming rectangular contact strips on a first side of and adjacent to a first end of the base package and forming base contact pads separated from the rectangular contact strips, on a first side of and adjacent to a second end of the base package opposite the first end, and connected to electrical interconnect positioning a stack package with a stack contact pad in contact with the electrical interconnect;

inserting the base package and the stack package into the device casing, the stack contact pad and the electrical interconnect clamped together between facing sides of the stack package and the base package; and inserting a memory device cap having tapered cap retainers in the memory device casing.

7. The method as claimed in claim 6 wherein:
positioning the stack package includes positioning the stack package of a rectangular-box shape containing second memory or controller circuitry and including:
   forming the stack contact pads on the stack package connected to the electrical interconnects.

8. The method as claimed in claim 6 wherein:
inserting the memory device cap includes inserting the memory device cap in the memory device casing to removably secure the base package relative to the stack package.

9. The method as claimed in claim 6 wherein:
inserting the base package and the stack package includes placing the base package and the stack package in the memory device cap for removably holding the stack package relative to the base package.

10. The method as claimed in claim 6 wherein:
inserting the base package and the stack package includes placing the base package and the stack package in the memory device cap for holding the stack package relative to the base package; and
inserting the memory device cap includes inserting the memory device cap in a memory device casing and removably retained therein.

11. An integrated circuit package system comprising:
a device casing;
a base package of an elongated rectangular-box shape containing first electrical circuitry, the base package includes:
   a rectangular contact strip on and adjacent to a first end of the base package and
   a base contact pad separated from the rectangular contact strip, on and adjacent to a second end of the base package opposite the first end, and for connection to an electrical interconnect;
a stack package with a stack contact pad in contact with the electrical interconnect;
the base package and the stack package inserted in the device casing, the stack contact pad and the electrical interconnect clamped together between facing sides of the stack package and the base package; and
a device cap having tapered cap retainers in the device casing.

12. The system as claimed in claim 11 wherein:
the stack package includes the stack package having a rectangular-box shape containing second electrical circuitry and including:
   the stack contact pad on the stack package for connection to the electrical interconnect.

13. The system as claimed in claim 11 wherein:
the device cap in the device casing includes the device cap to removably secure the base package relative to the stack package.

14. The system as claimed in claim 11 wherein:
the device cap includes the device cap for removably holding the stack package relative to the base package.

15. The system as claimed in claim 11 wherein:
the device cap includes the device cap for holding the stack package relative to the base package; and
the device casing includes the device casing for removably retaining the device cap therein.

16. The system as claimed in claim 11 wherein:
the first electrical circuitry includes first memory or controller.

17. The system as claimed in claim 16 further comprising:
a stack package of a rectangular-box shape containing second memory or controller circuitry and including:
   stack contact pads on the stack package connected to the electrical interconnects.

18. The system as claimed in claim 16 further comprising:
a stack package of a rectangular-box shape containing second memory or controller circuitry electrically connected to the base package;
a memory device casing with the base package and the stack package electrically interconnected therein; and
a memory device cap in the memory device casing to removably secure the base package relative to the stack package.

19. The system as claimed in claim 16 further comprising:
a stack package of a rectangular-box shape containing second memory or controller circuitry electrically connected to the base package; and
a memory device cap for removably holding the stack package relative to the base package.

20. The system as claimed in claim 16 further comprising:
a stack package of a rectangular-box shape containing second memory or controller circuitry electrically connected to the base package;
a memory device cap for holding the stack package relative to the base package; and
a memory device casing for removably retaining the memory device cap therein.

* * * * *

UNITED STATES PATENT AND TRADEMARK OFFICE
CERTIFICATE OF CORRECTION

PATENT NO. : 8,288,860 B2
APPLICATION NO. : 12/207493
DATED : October 16, 2012
INVENTOR(S) : Chin et al.

Page 1 of 1

It is certified that error appears in the above-identified patent and that said Letters Patent is hereby corrected as shown below:

In the Specification

Column 6:
Line 38, delete "two opposite comers" and insert therefor --two opposite corners--

Lines 39-40, delete "shaped comers 432" and insert therefor --shaped corners 432--

In the Claims

Column 10:
Claim 5, line 53, delete "wherein" and insert therefor --wherein:--

Column 12:
Claim 6, line 4, delete "electrical interconnect" and insert therefor --electrical interconnect;--

Signed and Sealed this
Twenty-fourth Day of September, 2013

Teresa Stanek Rea
*Deputy Director of the United States Patent and Trademark Office*